(12) United States Patent
Jain et al.

(10) Patent No.: US 10,355,693 B1
(45) Date of Patent: Jul. 16, 2019

(54) EXTENDED GPIO (EGPIO)

(71) Applicant: QUALCOMM Incorporated, San Diego, CA (US)

(72) Inventors: Varun Jain, San Diego, CA (US); Brent Duckering, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/101,586

(22) Filed: Aug. 13, 2018

Related U.S. Application Data

(60) Provisional application No. 62/642,702, filed on Mar. 14, 2018.

(51) Int. Cl.
*H03K 19/0185* (2006.01)
*H04W 52/02* (2009.01)
*H03K 19/003* (2006.01)

(52) U.S. Cl.
CPC ........... *H03K 19/018507* (2013.01); *H03K 19/00346* (2013.01); *H04W 52/028* (2013.01)

(58) Field of Classification Search
CPC .... H03K 19/018507; H03K 19/00346; H04W 52/028
See application file for complete search history.

(56) References Cited

U.S. PATENT DOCUMENTS

| 6,425,102 | B1* | 7/2002 | Matsushita | G06F 11/27 714/30 |
| 6,856,173 | B1* | 2/2005 | Chun | H03K 17/005 326/105 |
| 7,369,815 | B2 | 5/2008 | Kang et al. | |
| 8,994,412 | B2 | 3/2015 | Kim | |
| 9,267,989 | B2 | 2/2016 | Chen et al. | |
| 9,311,206 | B2 | 4/2016 | Culshaw et al. | |
| 9,831,875 | B2 | 11/2017 | Reddy et al. | |
| 2007/0060093 | A1* | 3/2007 | Kerth | H04W 52/028 455/296 |

* cited by examiner

*Primary Examiner* — Daniel C Puentes
(74) *Attorney, Agent, or Firm* — Qualcomm Incorporated

(57) ABSTRACT

An extended General Purpose Input/Output (eGPIO) scheme is disclosed. In some implementations, an input/output (I/O) boundary scan cell comprises an output path to route output signals from a first voltage domain and signals from a second voltage domain to an I/O pad operating in a pad voltage domain, the output path having a first level shifter to up shift the output signals from the first voltage domain or the second voltage domain to the pad voltage domain; an input path to receive input signals from the I/O pad, the input path having a second level shifter to down shift the input signals from the pad voltage domain to the second voltage domain; and test logic to test signals in the first voltage domain and the second voltage domain.

25 Claims, 8 Drawing Sheets

US 10,355,693 B1

EXTENDED GPIO (EGPIO)

CLAIM OF PRIORITY UNDER 35 U.S.C. § 119

The present Application for Patent claims priority to Provisional Application No. 62/642,702 entitled "Extended GPIO (eGPIO)" filed Mar. 14, 2018, and assigned to the assignee hereof and hereby expressly incorporated by reference herein.

FIELD OF DISCLOSURE

Aspects of the present disclosure relate generally to input/output (I/O) of semiconductor chips, and more particularly to extended General Purpose I/O (eGPIO).

BACKGROUND

Generally, I/O pads (a.k.a. pads) of semiconductor chips are configured to operate in a voltage domain of higher voltage range commonly referred to as pad voltage domain. Core circuitry of semiconductor chips are configured to operate in voltage domains of lower voltage range, commonly referred to as core voltage domains. Further, many semiconductor chips support multiple core voltage domains, some of which are collapsible during low power mode, while others remain on. As such, input/output (I/O) architecture of semiconductor chip are typically designed to provide an interface that supports routing and processing signals in both pad voltage domain and core voltage domains.

SUMMARY OF THE DISCLOSURE

The following presents a simplified summary of one or more implementations to provide a basic understanding of such implementations. This summary is not an extensive overview of all contemplated implementations and is intended to neither identify key or critical elements of all implementations nor delineate the scope of any or all implementations. The sole purpose of this summary is to present some concepts of one or more implementations in a simplified form as a prelude to the more detailed description that is presented later.

In some implementations, an input/output (I/O) boundary scan cell comprises an output path to route output signals from a first voltage domain and signals from a second voltage domain to an I/O pad operating in a pad voltage domain, the output path having a first level shifter to up shift the output signals from the first voltage domain or the second voltage domain to the pad voltage domain; an input path to receive input signals from the I/O pad, the input path having a second level shifter to down shift the input signals from the pad voltage domain to the second voltage domain; and test logic to test signals in the first voltage domain and the second voltage domain.

In some implementations, the I/O boundary scan cell further comprises an input enable path to process signals in at least one of the first and the second voltage domains and to output an input enable signal in the pad voltage domain to the I/O pad.

In some implementations, the I/O boundary scan cell further comprises an output enable path to process signals in at least one of the first and the second voltage domains and to output an output enable signal in the pad voltage domain to the I/O pad.

In some implementations, the I/O boundary scan cell further comprises a drive strength and pull control circuit to process signals in at least one of the first and the second voltage domains and to output a drive strength and pull control signal in the pad voltage domain to the I/O pad.

In some implementations, the first voltage domain is collapsible in a low power mode. Further, the second voltage domain may remain on in the low power mode.

In some implementations, the pad voltage domain has a voltage level higher than a first maximum voltage level of the first voltage domain. Likewise, the pad voltage domain can have a voltage level higher than a second maximum voltage level of the second voltage domain.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form to avoid obscuring such concepts.

Semiconductor chips typically include many inputs/outputs (I/Os). The I/Os of a semiconductor chip are coupled to I/O pads (which may simply be referred to as "pads") to provide an interface for routing signals to/from circuitry internal to the semiconductor chip (a.k.a. core circuitry) from/to the I/O pads. Many complex semiconductor chips support at least one low power mode, in which some circuits or subsystems within a semiconductor chip may be power collapsed or turned off, while some subsystems within the semiconductor chip remain on. The subsystems that remain on during low power mode can also be referred to as "always-on" subsystems, such as, for example, sensor subsystems, audio subsystem, and/or wireless local area network (WLAN) connection subsystem. The I/Os of the always-on subsystems typically have dedicated pads assigned because these I/Os remain on during low power mode. One example of such conventional I/O architecture is shown in FIG. 1.

Figure 1:
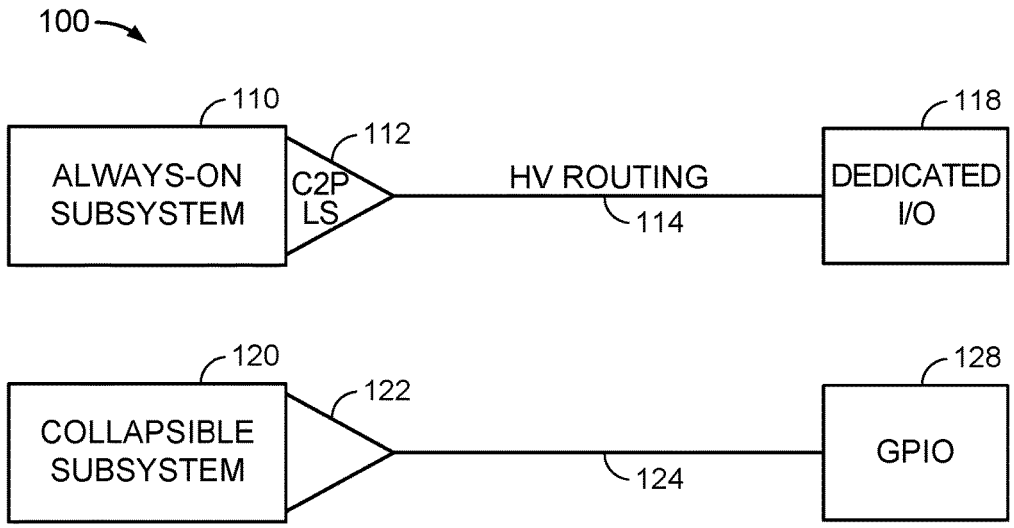
FIG. 1 is a conventional I/O scheme.

FIG. 1 shows one conventional I/O architecture in a semiconductor chip. The semiconductor chip 100 includes an always-on subsystem 110, a first level shifter 112, a first high voltage (HV) routing 114, a dedicated I/O 118, a subsystem 120, a second level shifter 122, a second routing 124, and a general-purpose I/O (GPIO) 128. Always-on subsystem 110 is coupled to dedicated I/O 118 via the first level shifter 112 and first routing 114. Likewise, subsystem 120 is coupled to GPIO 128 via the second level shifter 122 and second routing 124. As its name suggests, always-on subsystem 110 is always powered on even when the semiconductor chip 100 is in low power mode. Unlike always-on subsystem 110, subsystem 120 can be power collapsed or turned off when the semiconductor chip 100 enters a low power mode. Dedicated I/O 118 is specifically assigned (or dedicated) to always-on subsystem 110 because second routing 124 to GPIO 128 remains powered collapsed during low power mode and GPIO 128 cannot be used to mux always-on subsystems' I/Os.

While such conventional I/O architecture is simple to design, there are several issues associated with such I/O architecture. One issue of the conventional I/O architecture is the increased number of I/O pads. However, the number of I/O pads are limited by the physical dimension of the chip and the package. A second issue of the conventional I/O architecture is the lack of flexibility in re-purposing the dedicated I/Os as GPIOs in applications where one or more of the always-on subsystems are not used. As a result, pads assigned to an unused always-on subsystem cannot be repurposed.

Figure 2:
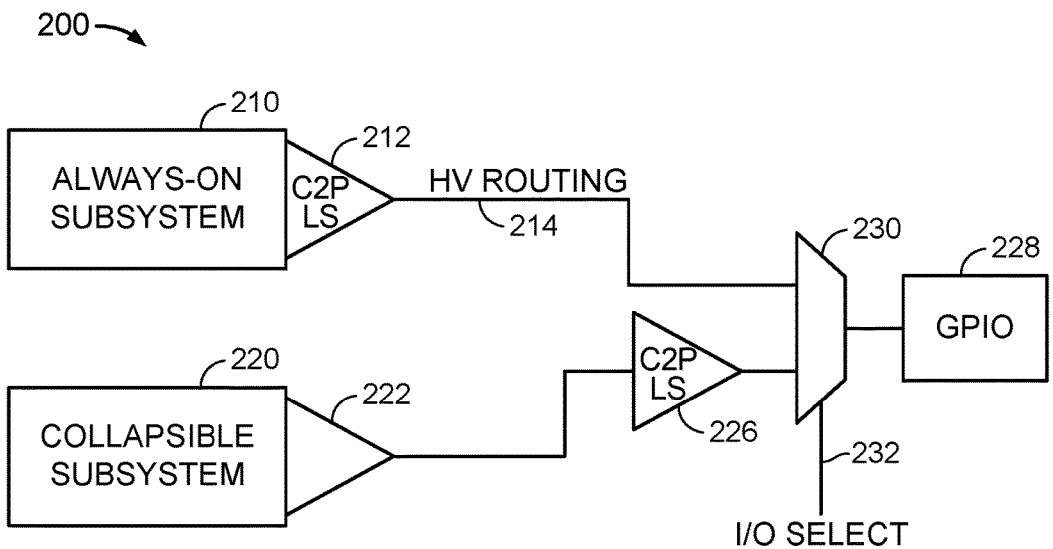
FIG. 2 is another conventional I/O scheme.

FIG. 2 shows another conventional I/O architecture in another semiconductor chip. The semiconductor chip 200 includes a first subsystem 210 that is always-on, a first level shifter 212, a first routing 214, a second subsystem 220 that is not always-on, a second level shifter 222, a third level shifter 226, a multiplexer 230, and a GPIO 228. The always-on subsystem 210 is coupled to a first input of multiplexer 230 via the first level shifter 212 and routing 214. The first level shifter 212 is a core-to-pad level shifter that outputs signals in the pad voltage domain, which is generally at a higher voltage than core voltage domain voltages. The routing 214 includes high voltage (HV) routing to route signals in the pad voltage domain. Multiplexer 230 also operates in the pad domain. The output of multiplexer 230 is coupled to GPIO 228. Multiplexer 230 may be implemented using one or more high voltage cells. Subsystem 220 is coupled to a second input of multiplexer 230 via the second level shifter 222 and the third level shifter. The second level shifter 222 can be a core-to-core level shifter and the third level shifter 226 can be a core-to-pad level shifter.

In operation, multiplexer 230 can select a signal from always-on subsystem 210 or a signal from subsystem 220 based on I/O select signal 232. Multiplexer 230 outputs the selected signal to GPIO 228. As such, both always-on subsystem 210 and non-always-on subsystem 220 can share GPIO 228. However, one issue with this conventional I/O architecture is the need of core-pad interface logic to be routed in pad voltage domain, which is typically at a voltage higher than the voltage of other voltage domains in the core of the semiconductor chip 200. Such routing requires additional core-to-pad level shifter (e.g., the third level shifter 226), high voltage combinational cells (e.g., multiplexer 230), and wire routes (e.g., high voltage routing 214), which is increasingly becoming a yield risk and silicon area overhead in advanced technology nodes.

Accordingly, there is a need in the art to provide an I/O architecture that support multi-voltage I/O muxing scheme without adding a substantial amount of high voltage circuitry, which not only takes up valuable silicon area, but also increases yield risk. Some implementations of a novel I/O architecture that provides a multi-voltage I/O boundary scan cell to reduce high voltage routing and to extend multiplexing capabilities are described below. Such I/O architecture may also be referred to as extended GPIO (eGPIO).

Figure 3:
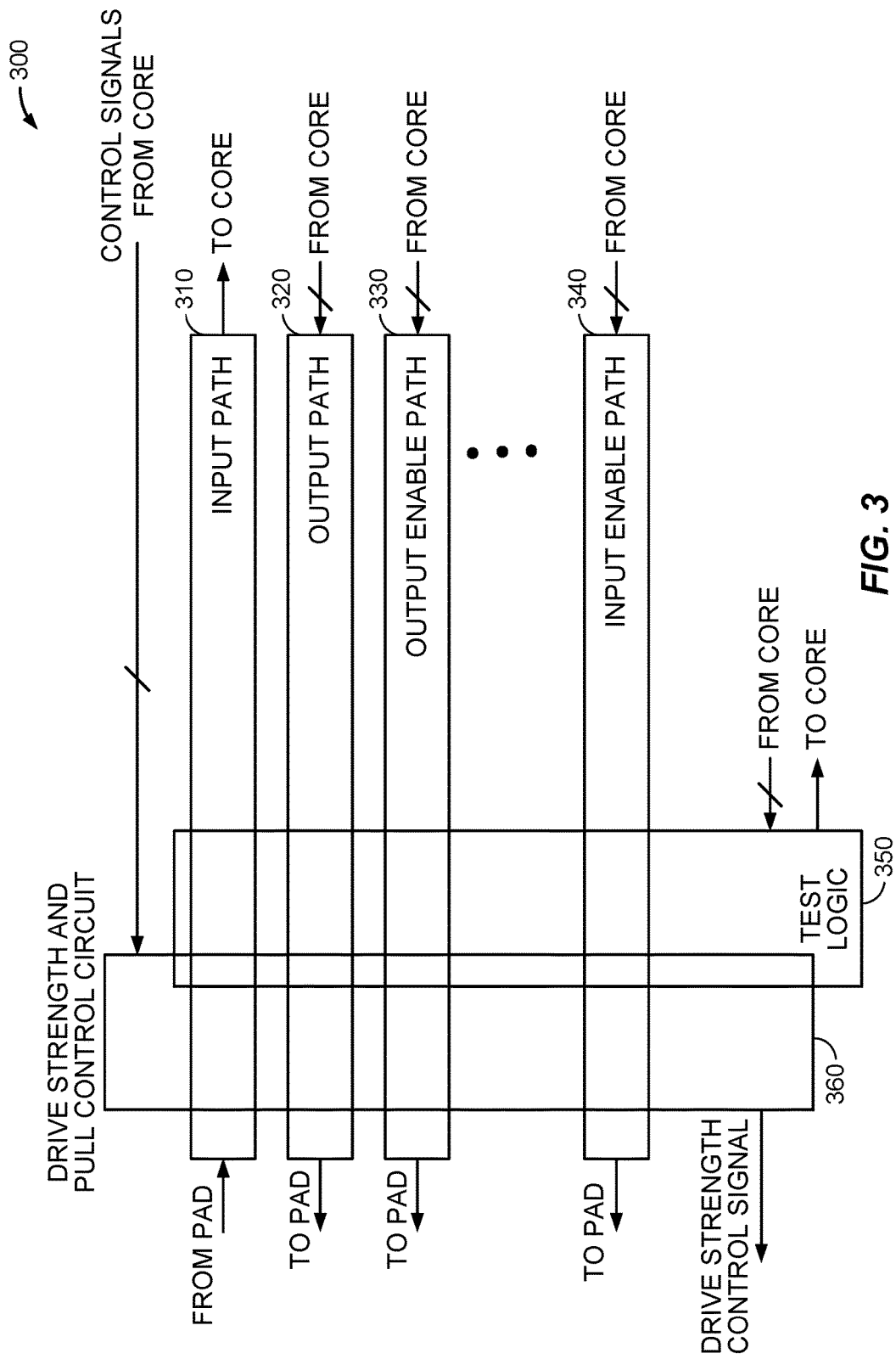
FIG. 3 is one implementation of an extended General Purpose I/O (eGPIO) boundary scan cell.

FIG. 3 shows a conceptual block diagram of one implementation of an eGPIO boundary scan cell 300 in a semiconductor chip. The eGPIO boundary scan (BSCAN) cell 300 provides an interface between a pad of the semiconductor chip and subsystems in a core of the semiconductor chip. The pad is in a pad voltage domain (PX). The subsystems in the core can operate in one or more core voltage domains lower than the pad voltage domain (e.g., CX, MX, etc.). The eGPIO BSCAN cell 300 includes an input path 310, an output path 320, an output enable path 330, an input enable path 340, test logic 350, and drive strength and pull control circuit 360. It should be appreciated that eGPIO BSCAN cell 300 can include additional input path, output path, input enable path, output enable path, and test logic. However, these additional input/output paths are not illustrated in FIG. 3 to avoid obscuring the view.

As shown in FIG. 3, input path 310, output path 320, output enable path 330, input enable path 340, and test logic 350 overlap with drive strength and pull control circuit 360. The overlapping of these blocks represents sharing of at least some of the high voltage level shifters and infrastructure in drive strength and pull control circuit 360 with input path 310, output path 320, output enable path 330, input enable path 340, and test logic 350. Likewise, test logic 350 overlaps with input path 310, output path 320, output enable path 330, input enable path 340, and drive strength and pull control circuit 360. The overlapping of these blocks also represents sharing of at least some of the high voltage level shifters and infrastructure in test logic 350 with input path 310, output path 320, output enable path 330, input enable path 340, and drive strength and pull control circuit 360.

In some implementations, drive strength and pull control circuit 360 receives control signals from multiple core voltage domains. Based on the control signals received, drive strength and pull control circuit 360 generates a drive strength and pull control signal in pad voltage domain. In addition, drive strength and pull control circuit 360 can generate control signals to be routed internal to cell 300 to other blocks to provide drive strength and pull control, such as input path 310, output path 320, etc. As a result, high voltage wire routing can be significantly reduced or optimized. More details of one implementation of drive strength and pull control circuit 360 are discussed below with reference to FIG. 7.

In some implementations, input path 310 receives an input signal from the pad. The input signal is in PX when received. Thus, input path 310 can include a pad-to-core level shifter to down shift the input signal to one of the core voltage domains. As such, high voltage wire routing can be eliminated within the input path. More details of one implementation of input path 310 are discussed below with reference to FIG. 4.

In some implementations, output path 320 receives an output signal from the core. The output signal can be from an always-on subsystem and/or a subsystem that can be power collapsed in low power mode. The output signal is in one or both of the core voltage domains. For example, if the output signal is from the always-on subsystem, then the output signal is in MX voltage domain. If the output signal is from a subsystem that can be power collapsed in low power mode, then the output signal is in a CX voltage domain. Thus, output path 320 can include a core-to-pad level shifter to up shift the output signal to PX before sending the output signal to the pad. More details of one implementation of output path 320 are discussed below with reference to FIG. 6.

In some implementations, output enable path 330 receives control signals from the core. The control signals can be in CX and/or MX. Based on the control signals, output enable path 330 generates an output enable signal and level shift it up to PX before sending the output enable signal to the pad. More details of one implementation of output enable path 330 are discussed below with reference to FIG. 6.

In some implementations, input enable path 340 receives control signals from the core. The control signals can be in CX and/or MX. Based on the control signals, input enable path 340 generates an input enable signal and level shift it up to PX before sending the input enable signal to the pad. More details of one implementation of input enable path 340 are discussed below with reference to FIG. 5.

In some implementations, test logic 350 receives control signals from the core. The control signals received may include some of the control signals received by the other blocks, e.g., input enable path 340, output enable path 330, output path 320, and input path 310. During test mode, test logic 350 is configured to test various signal paths using the control signals of the aforementioned blocks to screen for defective signal paths (e.g., stuck at one or zero). Note that test logic 350 is capable of testing signal paths in two or more core voltage domains (e.g., CX and MX). More details of one implementation of test logic 350 are discussed below with reference to FIG. 8.

Unlike the conventional I/O architectures shown in FIGS. 1 and 2, all control signals and data signals are brought into the core voltage domains (e.g., MX, CX) within eGPIO BSCAN cell 300, instead of the high voltage PX. Only the final output stage signals going to the pad are level shifted to PX instead of level shifting signals internally and performing the computation in PX domain within eGPIO B SCAN cell 300. Further, the architecture shown in FIG. 3 also allows I/Os dedicated to always-on subsystems to be reused for collapsible I/O signals controlled by main application processor. Additional multiplexers are provided in input path 310, output path 320, output enable path 330, input enable path 340, and drive strength and pull control circuit 360 to allow switching between test mode and functional mode. As a result, the muxing capability of eGPIO BSCAN cell 300 is significantly extended to support I/O muxing and test scheme for multiple power domain I/O signals. To further illustrate the concept, some implementations of each of the blocks within eGPIO BSCAN cell 300 are discussed in detail below.

Figure 4:
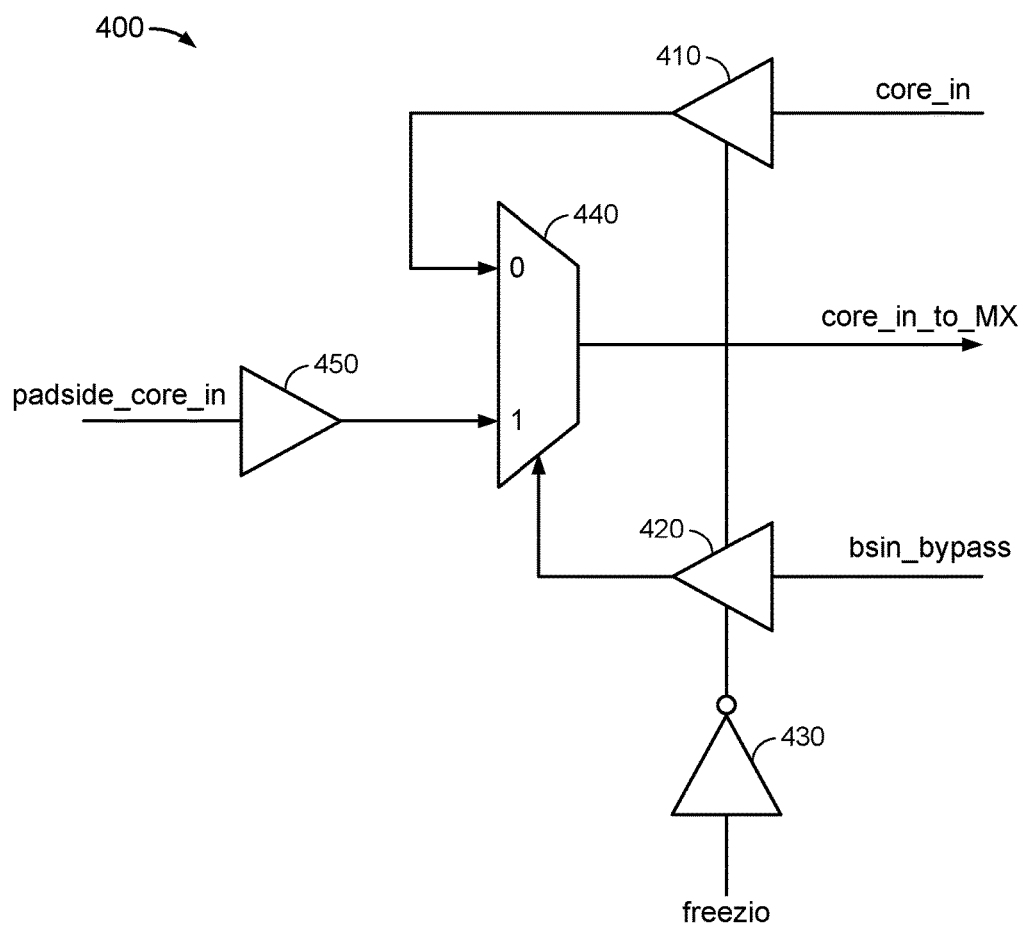
FIG. 4 shows one implementation of an input path 400 in an exemplary semiconductor chip.

FIG. 4 shows one implementation of an input path 400 in an exemplary semiconductor chip. In some implementations, there are at least three (3) voltage domains involved in the input path 400. In the current example, the three voltage domains are pad domain (PX), core domain (CX), and always-on power domain, such as memory domain (MX). The voltage range of PX is typically higher than the other domains because PX serves I/O pads that interface with routings and/or other chips external to the semiconductor chip. Further, PX is not collapsible. In other words, PX remains on whenever the semiconductor chip is powered on. The voltage range of MX in the current example is similar to CX. However, CX may be collapsible in low power mode, while MX remains on. Thus, circuitry that remains powered on in MX during low power mode may be referred to as "islands."

Referring to FIG. 4, the input path 400 includes a first level shifter 410, a second level shifter 420, an inverter 430, a multiplexor (MUX) 440, and a third level shifter 450. Level shifters 410 and 420 are configured to convert signals from CX to MX. Inverter 430 and MUX 440 operate in MX. Level shifter 450 is configured to convert signals from PX to MX.

In operation, level shifter 450 receives an input signal padside_core_in from PX and downshifts it to MX. Level shifter 410 level shifts an internal signal core_in from CX to MX before inputting the signal to MUX 440. MUX 440 can select the downshifted signal from level shifter 450 or the level shifted internal signal from level shifter 410 in response to a control signal from level shifter 420. Level shifter 420 receives a boundary scan input bypass control signal bsin_bypass in CX and level shifts bsin_bypass to MX to generate the control signal. Inverter 430 receives a low power control signal freezio and generates an inverted version of freezio to input to level shifters 410 and 420 to enable level shifters 410 and 420. It should be appreciated that once level shifter 450 has downshifted padside_core_in from PX to MX, the remaining processing in the input path 400 is performed in MX, thus eliminating the use of PX domain circuitry in the rest of input path 400.

Figure 5:
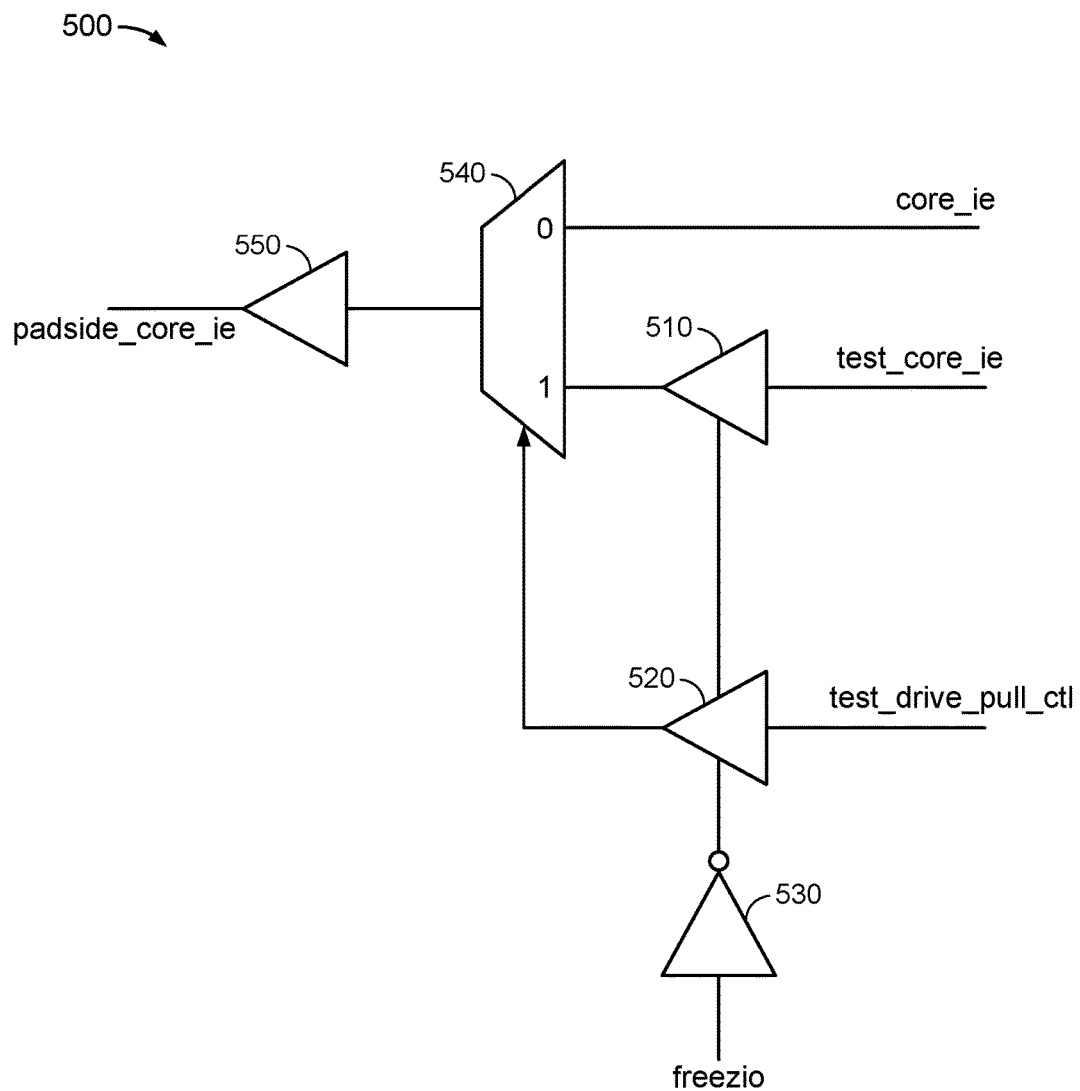
FIG. 5 shows one implementation of an input enable path 500 in an exemplary semiconductor chip.

FIG. 5 shows one implementation of an input enable path 500 in an exemplary semiconductor chip. Similar to input path 400 in FIG. 4, input enable path 500 also involves the three voltage domains discussed above, namely, PX, MX, and CX. Referring to FIG. 5, input enable path 500 includes a first level shifter 510, a second level shifter 520, an inverter 530, a multiplexer 540, and a third level shifter 550. Inverter 530 and MUX 540 are configured to operate in MX. Level shifters 510 and 520 are configured to level shift signals from CX to MX. Level shifter 550 is configured to upshift signals from MX to PX.

During operation, inverter 530 inverts freezio and applies the inverted freezio to enable level shifters 510 and 520. Level shifter 520 receives another drive strength and pull DFT (design for testing) control signal test_drive_pull_ctl from CX, level shifts test_drive_pull_ctl to MX, and then inputs the downshifted test_drive_pull_ctl to MUX 540 to control the input selection of MUX 540. MUX 540 receives two input signals. One input signal is core_ie in MX. The other input signal is a level shifted test_core_ie from level shifter 510. Level shifter 510 level shifts test_core_ie from CX to MX. Based on test_drive_pull_ctl, MUX 540 selects one of core_ie and the level shifted test_core_ie. MUX 540 outputs the selected signal to level shifter 550. Level shifter 550 upshifts the output signal of MUX 540 from MX to PX as padside_core_ie. It should be appreciated that most signal processing of input enable path 500 is performed in MX, with the final result upshifted by level shifter 550 to produce padside_core_ie ready to be transmitted to the pad. Thus, the use of PX domain circuitry can be minimized in most of input enable path 500.

Figure 6:
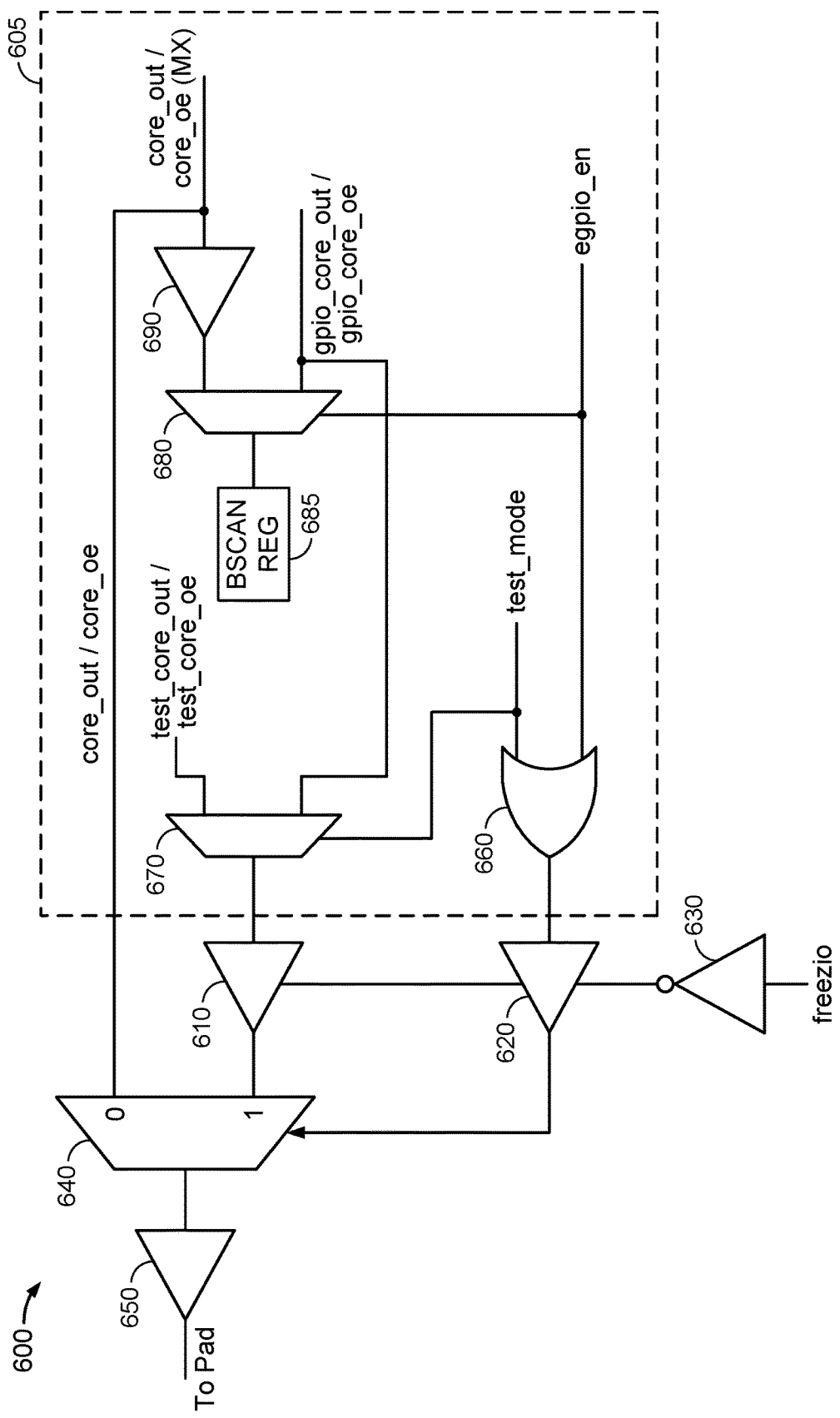
FIG. 6 shows one implementation of an output or output enable path 600 in an exemplary semiconductor chip.

FIG. 6 shows one implementation of an output or output enable path 600 in an exemplary semiconductor chip. Similar to input path 400 in FIG. 4, output or output enable path 600 also involves the three voltage domains discussed above, namely, PX, MX, and CX. Furthermore, similar to input enable path 500 in FIG. 5, output or output enable path 600 includes a first level shifter 610, a second level shifter 620, an inverter 630, a multiplexer 640, and a third level shifter 650. Inverter 630 and MUX 640 are configured to operate in MX. Level shifters 610 and 620 are configured to level shift signals from CX to MX. Level shifter 650 is configured to upshift signals from MX to PX. In addition, circuitry within output or output enable path that take advantage of test logic reuse is shown in dashed box 605 in FIG. 6.

In some implementations, box 605 includes an OR gate 660, a first MUX 670, a second MUX 680, a boundary scan (B SCAN) register 685, and a level shifter 690. Level shifter 690 level shifts core_out (if path 600 is configured as an output path) or core_oe (if path 600 is configured as an output enable path) from always-on island power domain MX to CX for DFT computation, and then input the level shifted signal to MUX 680. MUX 680 receives a second data input, gpio_core_out (if path 600 is configured as an output path) or gpio_core_oe (if path 600 is configured as an output enable path) in CX from collapsible power domain. Based on egpio_en, MUX 680 selects one of the data inputs and forwards the selected data input to BSCAN register 685, which operates in CX.

In some implementations, gpio_core_out (if path 600 is configured as an output path) or gpio_core_oe (if path 600 is configured as an output enable path) in CX is also input to MUX 670. MUX 670 receives a second input signal, test_core_out (if path 600 is configured as an output path) or test_core_oe (if path 600 is configured as an output enable path). Based on DFT control signal test_mode, MUX 670 selects between DFT input signal or functional input from CX domain and outputs the selected signal to level shifter 610. Both control signals, egpio_en and test_mode are input to OR gate 660, which outputs a signal to level shifter 620. The level shifted output signal of OR gate 660 is input to MUX 640 to select one of the data inputs of MUX 640, i.e., core_out or core_oe, and the output of level shifter 610. The output of MUX 640 is forwarded to level shifter 650. Level shifter 650 upshifts the output of MUX 640 to PX and then forwards the upshifted signal to the pad. It should be appreciated that OR gate 660, MUX 670 and MUX 640 create a priority muxing scheme, which gives higher priority to DFT signals to propagate when test_mode is enabled in some implementations. Similar to input path 400 in FIG. 4 and input enable path 500 in FIG. 5, most processing in output or output enable path 600 are performed in CX or MX, thus minimizing PX domain circuitry in output or output enable path 600. It should also be appreciated that path 600 includes circuitry operable in CX (e.g., BSCAN register 685), as well as circuitry operable in MX (e.g., inverter 630, MUX 640). The feature of having different circuitries operable in different voltage domains (e.g., CX, MX) within path 600 (and hence, eGPIO boundary scan cell 300) can provide more flexibility in design.

Figure 7:
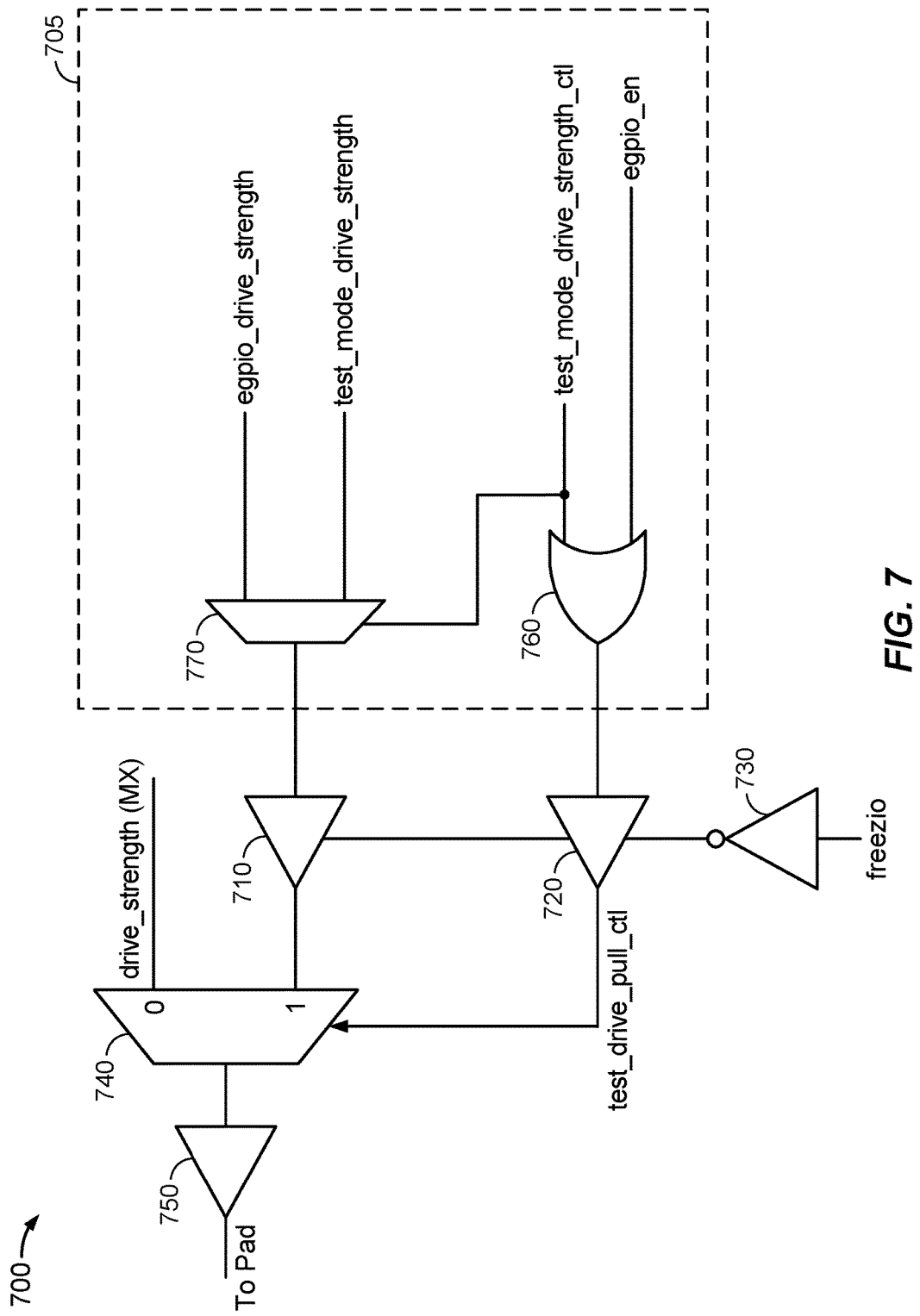
FIG. 7 shows one implementation of a drive strength and pull control circuit 700 in an exemplary semiconductor chip.

FIG. 7 shows one implementation of a drive strength and pull control circuit 700 in an exemplary semiconductor chip. Similar to input path 400 in FIG. 4, drive strength and pull control circuit 700 also involves the three voltage domains discussed above, namely, PX, MX, and CX. Furthermore, similar to input enable path 500 in FIG. 5, drive strength and pull control circuit 700 includes a first level shifter 710, a second level shifter 720, an inverter 730, a multiplexer 740, and a third level shifter 750. Inverter 730 and MUX 740 are configured to operate in MX. Level shifters 710 and 720 are configured to level shift signals from CX to MX. Level shifter 750 is configured to upshift signals from MX to PX.

In some implementations, drive strength and pull control circuit 700 further includes circuitry within box 705 shown in FIG. 7. The circuitry within box 705 can be configured to operate in CX. Specifically, box 705 includes an OR gate 760 and a MUX 770. MUX 770 receives two inputs, namely, egio_drive_strength from collapsible power domain and test_mode_drive_strength from DFT controller. MUX 770 selects one of the two inputs based on a control signal, test_mode_drive_strength ctl. MUX 770 forwards the selected input to level shifter 710 to level shift the selected signal from CX to MX. The signal test_mode_drive_strength ctl and a eGPIO enable signal, egpio_en, are input to OR gate 760. OR gate 760 forwards its output to level shifter 720 to level shift the output from CX to MX.

Similar to input enable path 500 in FIG. 5 and output or output enable path 600 in FIG. 6, inverter 730, and MUX 740 of drive strength and pull control circuit 700 operate in MX. Level shifter 710 and level shifter 720 level shift from CX to MX domain. Specifically, inverter 730 inverts control signal freezio and forward the inverted freezio to level shifters 710 and 720 to enable level shifter 710 and 720. Output of level shifter 710 and drive_strength (drive strength and pull control signal in MX) are input to MUX 740. MUX 740 selects one of the inputs based on test_drive_pull_ctl signal from level shifter 720. Finally, level shifter 750 upshifts the output signal of MUX 740 from MX to PX before forward the upshifted signal to pad. Again, it should be appreciated that most of the signal processing in drive strength and pull control circuit 700 are performed in lower voltage voltage domain, e.g., MX and/or CX. Thus, minimizing the need for complex processing circuitry in PX domain.

Figure 8:
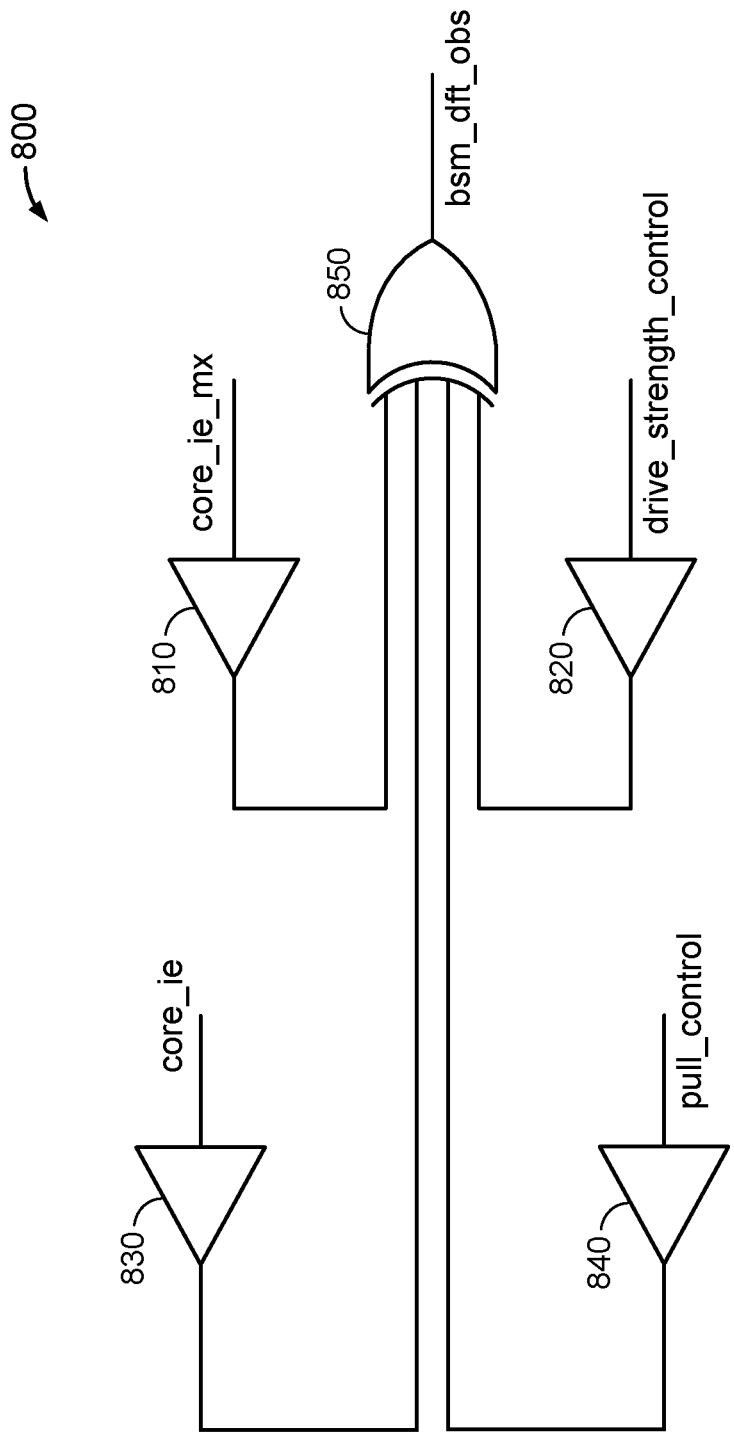
FIG. 8 shows one implementation of a design for test logic 800 in a boundary scan cell of an exemplary semiconductor chip.

FIG. 8 shows one implementation of a design for test logic 800 in a boundary scan cell of an exemplary semiconductor chip. Design for test logic 800 involves only the lower voltage core domains, e.g., CX and MX in the current example. Test logic 800 includes an XOR gate 850 and four (4) level shifters 810-840. Outputs of level shifters 810-840 are all coupled to input terminals of XOR gate 850. In some implementations, XOR gate 850 operates in CX. Internal signals in MX can be input to level shifters 810-840, which level shift the internal signals from MX to CX before outputting the level shifter signals to XOR gate 850. Specifically, core_ie_mx, core_ie, drive_strength_control, and pull_control signals are input to level shifters 810, 830, 820, and 840, respectively. XOR gate 850 then outputs a signal, bsm_dft_obs, which can be used in other testing circuitries in the core of the semiconductor chip.

In one implementation, all of core_ie_mx, core_ie, drive_strength_control, and pull_control signals are driven to a logical 0 during a test of the semiconductor chip. The output signal of XOR gate 850, bsm_dft_obs, is expected to become 0 under this test condition. If any one of the aforementioned signals are stuck at a logical one, then bsm_dft_obs will become a logical 1. In other implementations, the aforementioned signals can be driven to other values or combination of values to provide additional screening of the semiconductor.

It should be appreciated that test logic 800 can be implemented with circuitries in core voltage domains (e.g., CX and MX in the current example) because the internal signals of the boundary scan cell are kept in the core voltage domains. As discussed in detail above with reference to FIG. 4-7, the signals internal to various parts of the boundary scan cell are processed in the core voltage domains until the signals are ready to be transmitted to the pads, upon which, the signals are level shifted to PX (a higher voltage domain).

Figure 9:
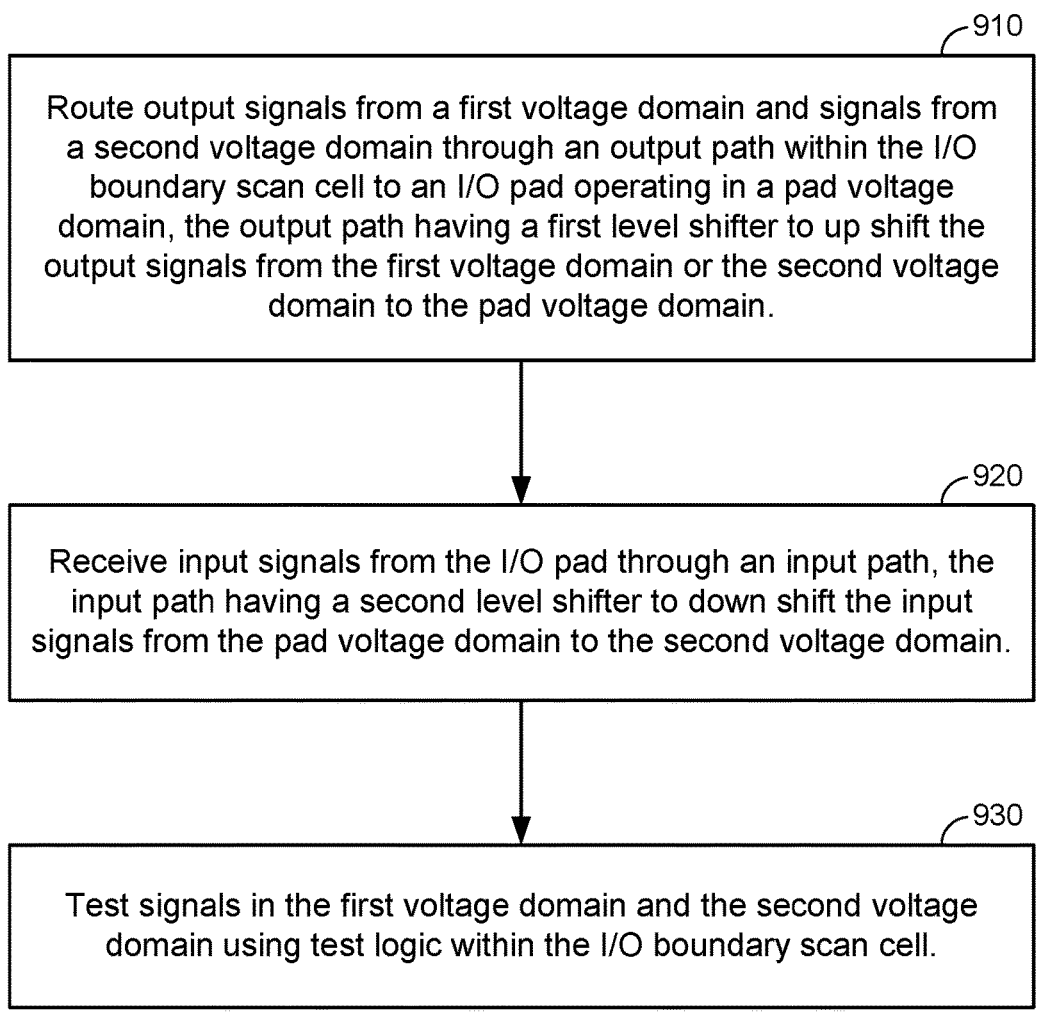
FIG. 9 shows a flow diagram to illustrate a method of using an I/O boundary scan cell.

FIG. 9 shows a flow diagram to illustrate a method of using an I/O boundary scan cell. The I/O boundary scan cell can be an eGPIO boundary scan cell, some implementations of which have been described in detail above. The method can be implemented using hardware, software, firmware, or a combination of any of the above. It should be appreciated that the steps of the method described below can be performed sequentially in various different orders, or simultaneously.

The method begins with block 910, where output signals from a first voltage domain and signals from a second voltage domain are routed through an output path within the I/O boundary scan cell to an I/O pad operating in a pad voltage domain. In some implementations, the output path has a first level shifter to up shift the output signals from the first voltage domain or the second voltage domain to the pad voltage domain.

The method then transitions to block 920, in which input signals are received from the I/O pad through an input path. In some implementations, the input path has a second level shifter to down shift the input signals from the pad voltage domain to the second voltage domain.

Finally, the method transitions to block 930, in which signals in the first voltage domain and the second voltage domain are tested using test logic within the I/O boundary scan cell.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An input/output (I/O) boundary scan cell, comprising:
   an output path to route output signals from a first voltage domain and signals from a second voltage domain to an I/O pad operating in a pad voltage domain, the output path having a first level shifter to up shift the output signals from the first voltage domain or the second voltage domain to the pad voltage domain;
   an input path to receive input signals from the I/O pad, the input path having a second level shifter to down shift the input signals from the pad voltage domain to the second voltage domain;
   test logic to test signals in the first voltage domain and the second voltage domain; and
   an input enable path to process signals in at least one of the first and the second voltage domains and to output an input enable signal in the pad voltage domain to the I/O pad.

2. The I/O boundary scan cell of claim 1, wherein the first voltage domain is collapsible in a low power mode.

3. An input/output (I/O) boundary scan cell, comprising:
   an output path to route output signals from a first voltage domain and signals from a second voltage domain to an I/O pad operating in a pad voltage domain, the output path having a first level shifter to up shift the output signals from the first voltage domain or the second voltage domain to the pad voltage domain;
   an input path to receive input signals from the I/O pad, the input path having a second level shifter to down shift the input signals from the pad voltage domain to the second voltage domain;
   test logic to test signals in the first voltage domain and the second voltage domain; and
   an output enable path to process signals in at least one of the first and the second voltage domains and to output an output enable signal in the pad voltage domain to the I/O pad.

4. The I/O boundary scan cell of claim 3, wherein the second voltage domain remains on in a low power mode.

5. An input/output (I/O) boundary scan cell, comprising:
   an output path to route output signals from a first voltage domain and signals from a second voltage domain to an I/O pad operating in a pad voltage domain, the output path having a first level shifter to up shift the output signals from the first voltage domain or the second voltage domain to the pad voltage domain;
   an input path to receive input signals from the I/O pad, the input path having a second level shifter to down shift the input signals from the pad voltage domain to the second voltage domain;
   test logic to test signals in the first voltage domain and the second voltage domain; and
   a drive strength and pull control circuit to process signals in at least one of the first and the second voltage domains and to output a drive strength and pull control signal in the pad voltage domain to the I/O pad.

6. The I/O boundary scan cell of claim 5, wherein the pad voltage domain has a voltage level higher than a first maximum voltage level of the first voltage domain.

7. The I/O boundary scan cell of claim 6, wherein the pad voltage domain has a voltage level higher than a second maximum voltage level of the second voltage domain.

8. An input/output (I/O) boundary scan cell, comprising:
   an output path to route output signals from a first voltage domain and signals from a second voltage domain to an I/O pad operating in a pad voltage domain, the output path having a first level shifter to up shift the output signals from the first voltage domain or the second voltage domain to the pad voltage domain;
   an input path to receive input signals from the I/O pad, the input path having a second level shifter to down shift the input signals from the pad voltage domain to the second voltage domain;
   test logic to test signals in the first voltage domain and the second voltage domain; and
   wherein the output path comprises:
     a boundary scan (B SCAN) register operable in the first voltage domain; and
     an inverter operable in the second voltage domain.

9. The I/O boundary scan cell of claim 8, wherein the first voltage domain is collapsible in a low power mode.

10. A method to use an input/output (I/O) boundary scan cell, comprising:
    routing output signals from a first voltage domain and signals from a second voltage domain through an output path within the I/O boundary scan cell to an I/O pad operating in a pad voltage domain, the output path having a first level shifter to up shift the output signals from the first voltage domain or the second voltage domain to the pad voltage domain;
    receiving input signals from the I/O pad through an input path, the input path having a second level shifter to down shift the input signals from the pad voltage domain to the second voltage domain;

testing signals in the first voltage domain and the second voltage domain using test logic within the I/O boundary scan cell; and enabling the input path to process signals in at least one of the first and the second voltage domains and to output an input enable signal in the pad voltage domain to the I/O pad.

11. The method of claim 10, wherein the first voltage domain is collapsible in a low power mode.

12. A method to use an input/output (I/O) boundary scan cell, comprising:

routing output signals from a first voltage domain and signals from a second voltage domain through an output path within the I/O boundary scan cell to an I/O pad operating in a pad voltage domain, the output path having a first level shifter to up shift the output signals from the first voltage domain or the second voltage domain to the pad voltage domain;

receiving input signals from the I/O pad through an input path, the input path having a second level shifter to down shift the input signals from the pad voltage domain to the second voltage domain;

testing signals in the first voltage domain and the second voltage domain using test logic within the I/O boundary scan cell; and enabling the output path to process signals in at least one of the first and the second voltage domains and to output an output enable signal in the pad voltage domain to the I/O pad.

13. The method of claim 12, wherein the second voltage domain remains on in a low power mode.

14. A method to use an input/output (I/O) boundary scan cell, comprising:

routing output signals from a first voltage domain and signals from a second voltage domain through an output path within the I/O boundary scan cell to an I/O pad operating in a pad voltage domain, the output path having a first level shifter to up shift the output signals from the first voltage domain or the second voltage domain to the pad voltage domain;

receiving input signals from the I/O pad through an input path, the input path having a second level shifter to down shift the input signals from the pad voltage domain to the second voltage domain;

testing signals in the first voltage domain and the second voltage domain using test logic within the I/O boundary scan cell;

processing signals using a drive strength and pull control circuit in at least one of the first and the second voltage domains; and outputting a drive strength and pull control signal in the pad voltage domain to the I/O pad using the drive strength and pull control circuit.

15. The method of claim 14, wherein the pad voltage domain has a voltage level higher than a first maximum voltage level of the first voltage domain.

16. The method of claim 15, wherein the pad voltage domain has a voltage level higher than a second maximum voltage level of the second voltage domain.

17. A method to use an input/output (I/O) boundary scan cell, comprising:

routing output signals from a first voltage domain and signals from a second voltage domain through an output path within the I/O boundary scan cell to an I/O pad operating in a pad voltage domain, the output path having a first level shifter to up shift the output signals from the first voltage domain or the second voltage domain to the pad voltage domain;

receiving input signals from the I/O pad through an input path, the input path having a second level shifter to down shift the input signals from the pad voltage domain to the second voltage domain; and testing signals in the first voltage domain and the second voltage domain using test logic within the I/O boundary scan cell;

wherein the output path comprises:
a boundary scan (B SCAN) register operable in the first voltage domain; and
an inverter operable in the second voltage domain.

18. An input/output (I/O) boundary scan cell, comprising:

means for routing output signals from a first voltage domain and signals from a second voltage domain through an output path within the I/O boundary scan cell to an I/O pad operating in a pad voltage domain, the output path having a first level shifter to up shift the output signals from the first voltage domain or the second voltage domain to the pad voltage domain;

means for receiving input signals from the I/O pad through an input path, the input path having a second level shifter to down shift the input signals from the pad voltage domain to the second voltage domain;

means for testing signals in the first voltage domain and the second voltage domain using test logic within the I/O boundary scan cell; and means for enabling the input path to process signals in at least one of the first and the second voltage domains and to output an input enable signal in the pad voltage domain to the I/O pad.

19. The I/O boundary scan cell of claim 18, wherein the first voltage domain is collapsible in a low power mode.

20. An input/output (I/O) boundary scan cell, comprising:

means for routing output signals from a first voltage domain and signals from a second voltage domain through an output path within the I/O boundary scan cell to an I/O pad operating in a pad voltage domain, the output path having a first level shifter to up shift the output signals from the first voltage domain or the second voltage domain to the pad voltage domain;

means for receiving input signals from the I/O pad through an input path, the input path having a second level shifter to down shift the input signals from the pad voltage domain to the second voltage domain;

means for testing signals in the first voltage domain and the second voltage domain using test logic within the I/O boundary scan cell; and means for enabling the output path to process signals in at least one of the first and the second voltage domains and to output an output enable signal in the pad voltage domain to the I/O pad.

21. The I/O boundary scan cell of claim 20, wherein the second voltage domain remains on in a low power mode.

22. An input/output (I/O) boundary scan cell, comprising:

means for routing output signals from a first voltage domain and signals from a second voltage domain through an output path within the I/O boundary scan cell to an I/O pad operating in a pad voltage domain, the output path having a first level shifter to up shift the output signals from the first voltage domain or the second voltage domain to the pad voltage domain;

means for receiving input signals from the I/O pad through an input path, the input path having a second level shifter to down shift the input signals from the pad voltage domain to the second voltage domain;

means for testing signals in the first voltage domain and the second voltage domain using test logic within the I/O boundary scan cell;

means for processing signals using a drive strength and pull control circuit in at least one of the first and the second voltage domains; and means for outputting a drive strength and pull control signal in the pad voltage domain to the I/O pad using the drive strength and pull control circuit.

23. The I/O boundary scan cell of claim 22, wherein the pad voltage domain has a voltage level higher than a first maximum voltage level of the first voltage domain.

24. The I/O boundary scan cell of claim 23, wherein the pad voltage domain has a voltage level higher than a second maximum voltage level of the second voltage domain.

25. An input/output (I/O) boundary scan cell, comprising:

means for routing output signals from a first voltage domain and signals from a second voltage domain through an output path within the I/O boundary scan cell to an I/O pad operating in a pad voltage domain, the output path having a first level shifter to up shift the output signals from the first voltage domain or the second voltage domain to the pad voltage domain;

means for receiving input signals from the I/O pad through an input path, the input path having a second level shifter to down shift the input signals from the pad voltage domain to the second voltage domain; and means for testing signals in the first voltage domain and the second voltage domain using test logic within the I/O boundary scan cell, wherein the output path comprises:
a boundary scan (B SCAN) register operable in the first voltage domain; and
an inverter operable in the second voltage domain.

* * * * *